(12) United States Patent
Kawata

(10) Patent No.: US 7,113,013 B2
(45) Date of Patent: Sep. 26, 2006

(54) PULSE GENERATING CIRCUIT AND SAMPLING CIRCUIT

(75) Inventor: Akihiro Kawata, Tokyo (JP)

(73) Assignee: Advantest Corporation, Tokyo (JP)

( * ) Notice: Subject to any disclaimer, the term of this patent is extended or adjusted under 35 U.S.C. 154(b) by 1 day.

(21) Appl. No.: 11/136,324

(22) Filed: May 24, 2005

(65) Prior Publication Data
US 2005/0264105 A1    Dec. 1, 2005

Related U.S. Application Data

(63) Continuation of application No. PCT/JP03/015066, filed on Nov. 26, 2003.

(30) Foreign Application Priority Data
Nov. 26, 2002 (JP) .............................. 2002-342873

(51) Int. Cl.
  *H03K 5/01*   (2006.01)
  *H03K 3/02*   (2006.01)
  *H03K 3/36*   (2006.01)
(52) U.S. Cl. ...................... 327/170; 327/171; 307/108
(58) Field of Classification Search ................ 327/170, 327/171; 307/108
See application file for complete search history.

(56) References Cited

U.S. PATENT DOCUMENTS

| 3,299,294 | A | * | 1/1967 | Koehler ..................... 327/302 |
| 3,676,708 | A | * | 7/1972 | Uchida ...................... 327/170 |
| 3,832,568 | A | * | 8/1974 | Wang ......................... 307/106 |

* cited by examiner

*Primary Examiner*—Evan Pert
(74) *Attorney, Agent, or Firm*—Osha Liang L.L.P.

(57) ABSTRACT

There is provided a pulse generating circuit, which generates two pulses having a sign of amplitude different from each other, including: a step recovery diode of which electric potential of an anode and a cathode is respectively output as the pulses; a bias unit operable to select either a forward bias or a backward bias according to a given control signal and apply the selected bias to the step recovery diode; a forward current source operable to prescribe a forward current to be supplied to the step recovery diode when the forward bias is applied to the step recovery diode; and a backward current source operable to prescribe a backward current to be supplied to the step recovery diode when the backward bias is applied to the step recovery diode.

10 Claims, 2 Drawing Sheets

PULSE GENERATING CIRCUIT AND SAMPLING CIRCUIT

CROSS REFERENCE TO THE RELATED APPLICATION

The present application is a continuation application of PCT/JP2003/015066 filed on Nov. 26, 2003, which claims priority from a Japanese Patent application No. 2002-342873 filed on Nov. 26, 2002, the entire contents of which are incorporated herein by reference for all purposes.

FIELD OF THE INVENTION

The present invention relates to a pulse generating circuit that generates pulses and a sampling circuit that samples signals.

DESCRIPTION OF THE RELATED ART

Conventionally, a sampling circuit that samples signals includes a pulse generating circuit that generates pulses and a sampling unit that samples signals based on these pulses. For example, the sampling unit, which has a diode bridge, receives two pulses having a sign of amplitude different from each other and signals that should be sampled, and then samples the signals based on the received pulses. In this case, the pulse generating circuit that generates two pulses by means of a circuit using a step recovery diode is known. When a reverse bias is applied, the step recovery diode precipitously makes a backward current zero after a predetermined delay time as disclosed, for example, in Japanese Patent Laid-Open No. 10-112636, particularly pages 1 and 2, and FIGS. 6 and 7 thereof.

A conventional pulse generating circuit has a module for applying a forward bias or a reverse bias to the step recovery diode and a current source for prescribing a forward current flowing into the step recovery diode. When the reverse bias is applied to the step recovery diode, the backward current precipitously becomes zero after a predetermined delay time, and thus pulses are generated on a cathode and an anode of the step recovery diode by means of an inductive component of a transmission line.

In the pulse generating circuit, although the pulses are generated after the reverse bias is applied and then a predetermined delay time elapses, the delay time depends on the forward current and the backward current flowing into the step recovery diode. However, a conventional pulse generating circuit only has a current source prescribing the forward current, and does not have a module prescribing the backward current. In other words, since the backward current depends on an amplitude value of the reverse bias, it is necessary to control the amplitude value of the reverse bias with high precision in order to prescribe the backward current with high precision. For this reason, it was difficult to control generation timing of the pulses with high precision.

For example, when using a transistor in order to select either the forward bias or the reverse bias to apply the selected bias to the step recovery diode, the amplitude value of the reverse bias is changed according to the change of ambient air temperature by means of temperature characteristics of a voltage between a base and a emitter of the transistor. For this reason, the backward current of the step recovery diode fluctuates, and thus it was difficult to control generation timing of the pulses with high precision.

For this reason, a conventional sampling circuit generates a jitter in the generation timing of the pulses, i.e., sampling timing, and thus it was difficult to sample signals with high precision. Particularly, since it is difficult to sample high frequency signals with high precision, there has been a problem that an upper frequency limit of signals capable of being measured goes down.

SUMMARY OF THE INVENTION

Therefore, it is an object of the present invention to provide a pulse generating circuit and a sampling circuit that can solve the foregoing problems. The above and other objects can be achieved by combinations described in the independent claims. The dependent claims define further advantageous and exemplary combinations of the present invention.

To solve this problem, according to the first aspect of the present invention, there is provided a pulse generating circuit that generates two pulses having a sign of amplitude different from each other. The pulse generating circuit includes: a step recovery diode of which electric potential of an anode and a cathode is respectively output as the pulses; a bias unit operable to select either a forward bias or a backward bias according to a given control signal and apply the selected bias to the step recovery diode; a forward current source operable to prescribe a forward current to be supplied to the step recovery diode when the forward bias is applied to the step recovery diode; and a backward current source operable to prescribe a backward current to be supplied to the step recovery diode when the backward bias is applied to the step recovery diode.

The pulse generating circuit may further include a filter unit operable to remove a DC component of the pulses. Moreover, the filter unit may include: an anode side capacitor of which one end is connected to the anode of the step recovery diode, the anode side capacitor outputting one of the pulses from another end thereof; and a cathode side capacitor of which one end is connected to the cathode of the step recovery diode, the cathode side capacitor outputting another of the pulses from another end thereof.

The pulse generating circuit may further include: an anode side transmission line that electrically connects the bias unit and the anode of the step recovery diode and has an inductive component; and a cathode side transmission line that electrically connects the bias unit and the cathode of the step recovery diode and has an inductive component. Moreover, the pulse generating circuit may further include a parallel capacitor that is provided in parallel with the step recovery diode between the bias unit and the step recovery diodes and connects the anode side transmission line and the cathode side transmission line.

The bias unit may include an anode side bias circuit electrically connected to the anode side transmission line and a cathode side bias circuit electrically connected to the cathode side transmission line, the cathode side bias circuit may include: a first transistor that is provided between a predetermined positive bias and a predetermined negative bias; and a second transistor that is provided in series with the first transistor between the first transistor and the predetermined negative bias, and is turned off when the first transistor is ON and is turned on when the first transistor is OFF, in which a connecting point between the first transistor and the second transistor may electrically be connected to the cathode side transmission line, and the anode side bias circuit may include: a third transistor that is provided between a predetermined positive bias and a predetermined negative bias, and is turned off when the first transistor is ON and is turned on when the first transistor is OFF; and a fourth transistor that is provided in series with the third transistor between the third transistor and the predetermined negative bias, and is turned on when the first transistor is ON and is turned off when the first transistor is OFF, in which a connecting point between the third transistor and the fourth transistor may electrically be connected to the anode side transmission line.

The forward current source may be provided in series with the second transistor or the third transistor between the second transistor and the negative bias or between the positive bias and the third transistors, and the backward current source may be provided in series with the first transistor or the fourth transistor between the positive bias and the first transistors or between the fourth transistor and the negative bias.

Moreover, the pulse generating circuit may further include a drive circuit operable to control timing at which the first transistor, the second transistor, the third transistor, and the fourth transistor are turned on or off according to the timing at which the pulses should be generated.

According to the second aspect of the present invention, there is provided a sampling circuit that samples given input signals. The sampling circuit includes: a pulse generating circuit operable to generate two pulses having a sign of amplitude different from each other, for sampling the input signals; and a sampling unit operable to receive the input signals and the pulses and sample the input signals based on the pulses, in which the pulse generating circuit includes: a step recovery diode of which electric potential of an anode and a cathode is respectively output as the pulses; a bias unit that applies a forward bias or a backward bias to the step recovery diode; a forward current source that prescribes a forward current supplied to the step recovery diode when the forward bias is applied to the step recovery diode; and a backward current source that prescribes a backward current to be supplied to the step recovery diode when the backward bias is applied to the step recovery diode.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
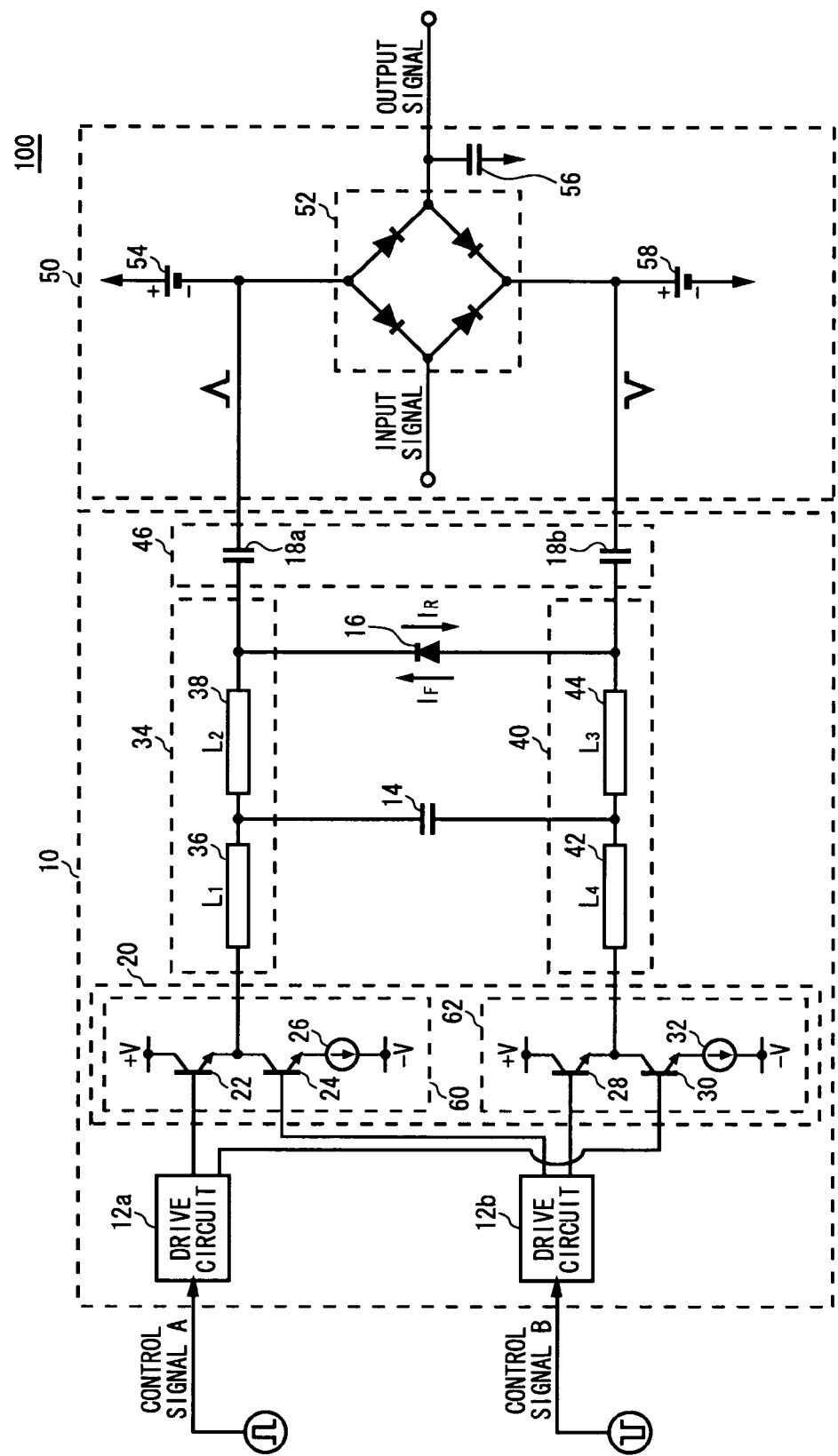
FIG. 1 is a view exemplary showing a configuration of a sampling circuit according to an embodiment of the present invention.

FIG. 1 is a view exemplary showing a configuration of a sampling circuit 100 according to the present invention. The sampling circuit 100 samples a given input signal at a predetermined timing. The sampling circuit 100 includes a pulse generating circuit 10 and a sampling unit 50.

The pulse generating circuit 10 generates pulses to determine timing at which input signals are sampled. The pulse generating circuit 10 includes drive circuits 12a and 12b, a bias unit 20, a step recovery diode 16, a cathode side transmission line 34, an anode side transmission line 40, a parallel capacitor 14, and a filter unit 46.

The drive circuits 12a and 12b receive control signals to generate pulses from the outside. The drive circuits 12a and 12b control the bias unit 20 according to the control signals.

The bias unit 20 selects either a forward bias or a backward bias, and applies the selected bias to the step recovery diode 16. In this example, the drive circuits 12a and 12b cause the bias unit 20 to select either the forward bias or the backward bias according to the control signals. The bias unit 20 has an anode side bias circuit 62 electrically connected to the anode side transmission line 40 and a cathode side bias circuit 60 electrically connected the cathode side transmission line 34.

The cathode side bias circuit 60 has a first transistor 22 that is provided between a predetermined positive bias and a predetermined negative bias, a second transistor 24 that is provided in series with the first transistor 22 between the first transistor 22 and the predetermined negative bias, and a forward current source 26 that is provided between the second transistor 24 and the predetermined negative bias.

Moreover, the anode side bias circuit 62 has a third transistor 28 that is provided between a predetermined positive bias and a predetermined negative bias, a fourth transistor 30 that is provided in series with the third transistor 28 between the third transistor 28 and the predetermined negative bias, and a backward current source 32 that is provided between the fourth transistor 30 and the predetermined negative bias.

The forward current source 26 prescribes a forward current to be supplied to the step recovery diode 16 when a forward bias is applied to the step recovery diode 16. The backward current source 32 prescribes a backward current to be supplied to the step recovery diode 16 when a backward bias is applied to the step recovery diode 16.

The drive circuits 12a and 12b control timing at which the first transistor 22, the second transistor 24, the third transistor 28, and the fourth transistor 30 are turned on or off according to the timing at which the pulses should be generated. For example, the drive circuits 12a and 12b control the first transistor 22, the second transistor 24, and the third transistor 26 so that a switch status of the first transistor 22 is different from a switch status of the second transistor 24 and the third transistor 26. In other words, the second transistor 24 and the third transistor 26 are controlled to be turned off when the first transistor 22 is turned on and the second transistor 24 and the third transistor 28 are controlled to be turned on when the first transistor 22 is turned off.

Moreover, the drive circuits 12a and 12b control the first transistor 22 and the fourth transistor 30 so that a switch status of these transistors is equal. In other words, the drive circuits 12a and 12b control the fourth transistor 30 to be turned on when the first transistor 22 is turned on, and control the fourth transistor 30 to be turned off when the first transistor 22 is turned off.

In this example, a signal of an Low level is supplied to the drive circuit 12a as the control signal A at normal time, and a pulse having positive amplitude is supplied to the drive circuit 12a as the control signal A when the pulses should be generated. The drive circuit 12a applies the voltage according to the supplied control signal A to base terminals of the first transistor 22 and the fourth transistor 30. At this time, since a voltage value to switch the first transistor 22 is different from a voltage value to switch the fourth transistor 30, it is preferable that the drive circuit 12a applies the voltage, which is made by shifting the voltage being applied to the first transistor 22, to the fourth transistor 30.

Moreover, a signal of an High level is supplied to the drive circuit 12b as the control signal B at normal time, and a pulse having negative amplitude is supplied to the drive circuit 12b as the control signal B when the pulses should be generated. The drive circuit 12b applies the voltage according to the supplied control signal B to base terminals of the second transistor 24 and the third transistor 28. At this time, since a voltage value to switch the second transistor 24 is different from a voltage value to switch the third transistor 28, it is preferable that the drive circuit 12b applies the voltage, which is made by shifting the voltage being applied to the second transistor 24, to the third transistor 28.

It is possible to select and apply either a positive bias or a negative bias to the step recovery diode 16 via the cathode side transmission line 34 and the anode side transmission line 40 by means of the operations of the drive circuits 12a and 12b and the bias unit 20 as described above. Moreover, it is possible to control the current values of a forward current flowing into the step recovery diode 16 when applying the positive bias to the step recovery diode 16 and a backward current flowing into the step recovery diode 16 when applying the negative bias to the step recovery diode 16 with high precision according to an arrangement of the forward current source 26 and the backward current source 32 as described above.

Moreover, the forward current source 26 may be provided in series with the third transistor 28 between the third transistor 28 and a predetermined positive bias, and the backward current source 32 may be provided in series with the first transistor 22 between the first transistor 22 and a predetermined positive bias. Moreover, the forward current source 26 and the backward current source 32 may be resistors to prescribe a current flowing into them.

The cathode side transmission line 34 is electrically connected to a connecting point between the first transistor 22 and the second transistor 24. Moreover, the cathode side transmission line 34 is electrically connected to a cathode of the step recovery diode 16, and applies the positive bias or the negative bias selected by the cathode side bias unit 60 to the cathode of the step recovery diode 16.

The anode side transmission line 40 is electrically connected to a connecting point between the third transistor 28 and the fourth transistor 30. Moreover, the anode side transmission line 40 is electrically connected to an anode of the step recovery diode 16, and applies the negative bias or the positive bias selected by the anode side bias unit 62 to the anode of the step recovery diode 16.

Moreover, the cathode side transmission line 34 has a first transmission line 36 and a second transmission line 38 that are provided in series and include an inductive component. Moreover, the anode side transmission line 40 has a third transmission line 44 and a fourth transmission line 42 that are provided in series and include an inductive component. The parallel capacitor 14 is provided in parallel with the step recovery diode 16 between a connecting point of the first transmission line 36 and the second transmission line 38 and a connecting point of the third transmission line 44 and the fourth transmission line 42.

When the forward bias is applied to the step recovery diode 16, the forward current flows from the positive bias of the anode side bias unit 62 to the negative bias of the cathode side bias unit 60 through the third transistor 28, the anode side transmission line 40, the step recovery diode 16, the cathode side transmission line 36, the second transistor 24, and the forward current source 26. Next, when the reverse bias is applied to the step recovery diode 16, although the backward current flows into the step recovery diode 16, the step recovery diode 16 precipitously makes the backward current zero after a predetermined delay time $t_s$. For this reason, step voltages having a sign different from each other are generated on the cathode and the anode of the step recovery diode 16 by means of an inductive component of the cathode side transmission line 34 and the anode side transmission line 40.

The generated step voltages are respectively reflected on the anode and the cathode of the step recovery diode 16 through the second transmission line 38, the parallel capacitor 14, and the third transmission line 44, and pulses having narrow width are generated on the cathode and the anode of the step recovery diode 16 by offsetting the generated step voltages and the reflected step voltages each other.

At this time, the predetermined delay time $t_s$ is defined by the following expression.

$$t_s = \tau \cdot \ln\left\{1 + \frac{I_F(1 - \exp(-t_f/\tau))}{I_R}\right\}$$

Here, $I_F$ is the forward current, $I_R$ is the backward current, $\tau$ is minority carrier lifetime in the step recovery diode 16, and $t_f$ is time for which the forward current flows.

As shown in the above expression, the delay time $t_s$ depend on the forward current and the backward current. However, according to the pulse generating circuit 10 of this example, since the forward current and the backward current can be prescribed with high precision, it is possible to control the delay time $t_s$ with high precision. For this reason, it is possible to control timing at which the pulses are generated with high precision to easily generate a group of pulses having few jitter components.

The electric potential of the anode and the cathode of the step recovery diode 16 is output to the sampling unit 50 as a pulse for sampling. Moreover, the filter unit 46 removes a DC component of the pulse. In other words, the filter unit 46 removes a bias component of the potential of the anode and the cathode and then outputs only the pulse to the sampling unit 50. In this example, the filter unit 46 has an anode side capacitor 18b of which one end is connected to the anode of the step recovery diode 16 and that outputs the pulse from another end and a cathode side capacitor 18a of which one end is connected to the cathode of the step recovery diode 16 and that outputs the pulse from another end.

The sampling unit 50 includes a diode bridge 52, DC power sources 54 and 58 for applying a predetermined bias of the diode bridge 52, and a capacitor 56. The diode bridge 52 receives input signals to be sampled from the outside, and receives pulses to determine sampling timing from the pulse generating circuit 10. The diode bridge 52 samples the input signals based on the received pulses, and outputs the sampled result as output signals. Moreover, the capacitor 56 holds the output signals.

According to the sampling circuit 100 of this example, since the pulses with few jitter components are generated and the sampling is performed, it is possible to sample the input signals with high precision. Moreover, it is preferable that the first transmission line 36 and the fourth transmission line 42 have impedance matching impedance of the bias unit 20 and impedance of a circuit below the parallel capacitor 14. Moreover, it is preferable that the parallel capacitor 14 has impedance capable of being adequately short-circuited with respect to rising time of the step voltages generated on the cathode and the anode of the step recovery diode 16.

Figure 2:
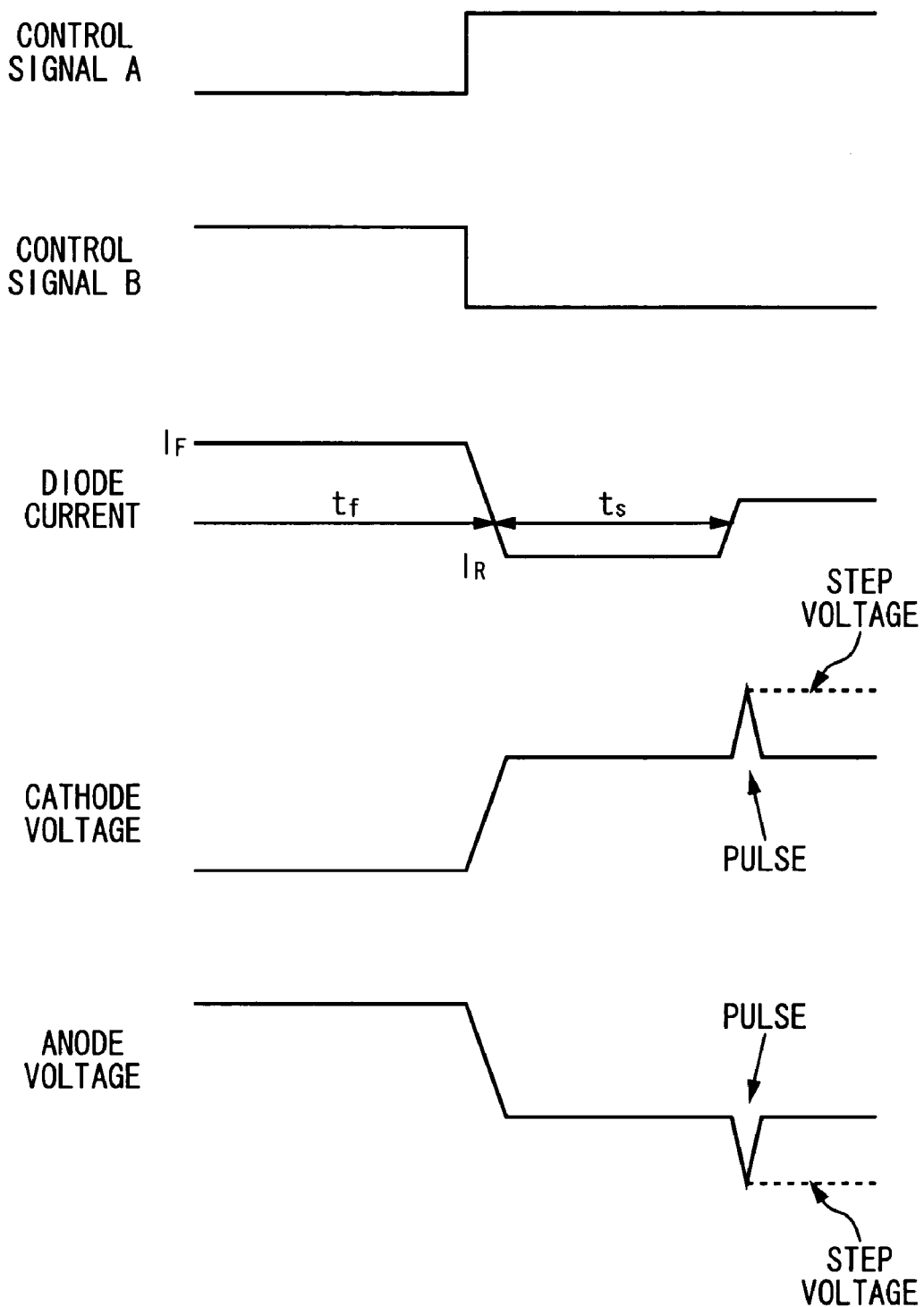
FIG. 2 is a view exemplary showing a timing chart for explaining an operation of a pulse generating circuit.

FIG. 2 is a view exemplary showing a timing chart for explaining an operation of the pulse generating circuit 10. At first, the forward current $I_F$ is supplied to the step recovery diode 16 by the time $t_f$. Next, the values of the control signal A and the control signal B are respectively changed, and the backward current $I_R$ is supplied to the step recovery diode 16. As described above, the step recovery diode 16 precipitously makes the backward current zero after the delay time $t_s$.

At this time, the step voltages with a sign different from each other are generated on the cathode and the anode of the step recovery diode 16 by means of the inductive component of the transmission lines. These step voltages are reflected on the reverse terminals of the step recovery diode 16 via the transmission lines and the parallel capacitor 14 to be offset. Therefore, it is possible to generate pulses having a predetermined pulse width on the cathode and the anode of the step recovery diode 16. Moreover, as described above, the filter unit 46 takes out and outputs only the generated pulses. At this time, the pulse width is determined by the transfer time in the second transmission line 38, the third transmission line 44, and the parallel capacitor 14. In other words, it is possible to control the pulse width by adjusting the transfer time in the second transmission line 38, the third transmission line 44, and the parallel capacitor 14.

Moreover, although the bias unit 20 explained in FIG. 1 performs the bias switching by means of a transistor, in another example, the bias unit 20 may perform the bias switching by means of a similar switching device. In other words, the bias switching may use a device, in which impedance between two points is changed by the supplied signal, in place of a transistor.

As is apparent from the above descriptions, according to the present invention, it is possible to easily generate a pulse with few jitter components and sample input signals with high precision.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

INDUSTRIAL APPLICABILITY

As apparent from the above descriptions, according to the present invention, it is possible to easily generate a pulse with few jitter components and sample input signals with high precision.

What is claimed is:

1. A pulse generating circuit that generates two pulses having sign of amplitude different from each other, comprising:
   a step recovery diode of which electric potential of anode and cathode is respectively output as the pulses;
   a bias unit operable to select either a forward bias or a backward bias according to a given control signal and apply the selected bias to said step recovery diode;
   a forward current source operable to prescribe a forward current to be supplied to said step recovery diode when the forward bias is applied to said step recovery diode; and
   a backward current source operable to prescribe a backward current to be supplied to said step recovery diode when the backward bias is applied to said step recovery diode.

2. The pulse generating circuit as claimed in claim 1, further comprising a filter unit operable to remove a DC component of the pulses.

3. The pulse generating circuit as claimed in claim 2, wherein
   said filter unit comprises:
   an anode side capacitor of which one end is connected to the anode of said step recovery diode, the anode side capacitor outputting one of the pulses from another end thereof; and
   a cathode side capacitor of which one end is connected to the cathode of said step recovery diode, the cathode side capacitor outputting another of the pulses from another end thereof.

4. The pulse generating circuit as claimed in claim 1, further comprising:
   an anode side transmission line that electrically connects said bias unit and the anode of said step recovery diode and has an inductive component; and
   a cathode side transmission line that electrically connects said bias unit and the cathode of said step recovery diode and has an inductive component.

5. The pulse generating circuit as claimed in claim 2, further comprising:
   an anode side transmission line that electrically connects said bias unit and the anode of said step recovery diode and has an inductive component; and
   a cathode side transmission line that electrically connects said bias unit and the cathode of said step recovery diode and has an inductive component.

6. The pulse generating circuit as claimed in claim 4, further comprising a parallel capacitor that is provided in parallel with said step recovery diode between said bias unit and said step recovery diodes and connects the anode side transmission line and the cathode side transmission line.

7. The pulse generating circuit as claimed in claim 6, wherein
   said bias unit comprises an anode side bias circuit electrically connected to the anode side transmission line and a cathode side bias circuit electrically connected to the cathode side transmission line,
   the cathode side bias circuit comprises:
   a first transistor that is provided between a predetermined positive bias and a predetermined negative bias; and
   a second transistor that is provided in series with the first transistor between the first transistor and the predetermined negative bias, and is turned off when the first transistor is ON and is turned on when the first transistor is OFF, wherein a connecting point between the first transistor and the second transistor is electrically connected to the cathode side transmission line, and
   the anode side bias circuit comprises:
   a third transistor that is provided between a predetermined positive bias and a predetermined negative bias, and is turned off when the first transistor is ON and is turned on when the first transistor is OFF; and a fourth transistor that is provided in series with the third transistor between the third transistor and the predetermined negative bias, and is turned on when the first transistor is ON and is turned off when the first transistor is OFF, wherein a connecting point between the third transistor and the fourth transistor is electrically connected to the anode side transmission line.

8. The pulse generating circuit as claimed in claim 7, wherein said forward current source is provided in series with the second transistor or the third transistor between the second transistor and the negative bias or between the positive bias and the third transistors, and said backward current source is provided in series with the first transistor or the fourth transistor between the positive bias and the first transistors or between the fourth transistor and the negative bias.

9. The pulse generating circuit as claimed in claim 7, further comprising a drive circuit operable to control timing at which the first transistor, the second transistor, the third transistor, and the fourth transistor are turned on or off according to the timing at which the pulses should be generated.

10. A sampling circuit that samples given input signals, comprising:

a pulse generating circuit operable to generate two pulses having sign of amplitude different from each other, for sampling the input signals; and a sampling unit operable to receive the input signals and the pulses and sample the input signals based on the pulses, wherein said pulse generating circuit comprises:

a step recovery diode of which electric potential of anode and cathode is respectively output as the pulses;

a bias unit that applies a forward bias or a backward bias to the step recovery diode;

a forward current source that prescribes a forward current supplied to the step recovery diode when the forward bias is applied to the step recovery diode; and a backward current source that prescribes a backward current to be supplied to the step recovery diode when the backward bias is applied to the step recovery diode.

* * * * *